(12) United States Patent
Lee

(10) Patent No.: US 11,315,638 B2
(45) Date of Patent: Apr. 26, 2022

(54) SEMICONDUCTOR MEMORY DEVICE INCLUDING SYSTEM BLOCK FOR SYSTEM DATA AND METHOD OF OPERATING THE SAME

(71) Applicant: SK hynix Inc., Icheon-si Gyeonggi-do (KR)

(72) Inventor: Sang Bum Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/922,576

(22) Filed: Jul. 7, 2020

(65) Prior Publication Data

US 2021/0210145 A1 Jul. 8, 2021

(30) Foreign Application Priority Data

Jan. 7, 2020 (KR) .................... 10-2020-0002164

(51) Int. Cl.
| | | |
|---|---|---|
| *G11C 8/00* | (2006.01) | |
| *G11C 16/16* | (2006.01) | |
| *G11C 16/26* | (2006.01) | |
| *G11C 16/24* | (2006.01) | |
| *G11C 16/08* | (2006.01) | |

(52) U.S. Cl.
CPC .............. *G11C 16/16* (2013.01); *G11C 16/08* (2013.01); *G11C 16/24* (2013.01); *G11C 16/26* (2013.01)

(58) Field of Classification Search
CPC ......... G11C 16/16; G11C 16/26; G11C 16/24; G11C 16/08
USPC ...................................................... 365/230.03
See application file for complete search history.

(56) References Cited

U.S. PATENT DOCUMENTS

| | | | | |
|---|---|---|---|---|
| 9,837,160 | B1 * | 12/2017 | Oh ..................... | G11C 16/0483 |
| 2018/0102172 | A1 * | 4/2018 | Yi ...................... | G11C 16/3445 |
| 2020/0225873 | A1 * | 7/2020 | Ock ..................... | G06F 3/0659 |
| 2020/0365219 | A1 * | 11/2020 | Singidi .................. | G11C 16/26 |
| 2021/0166774 | A1 * | 6/2021 | Cha ........................ | G11C 16/16 |

FOREIGN PATENT DOCUMENTS

KR        1020170126772 A      11/2017

\* cited by examiner

*Primary Examiner* — Vu A Le
(74) *Attorney, Agent, or Firm* — William Park & Associates Ltd.

(57) ABSTRACT

A semiconductor memory device, and a method of operating the semiconductor memory device, includes a memory cell array including a plurality of normal memory blocks and at least one system block, and a peripheral circuit configured to perform a program operation, a read operation, or an erase operation on the plurality of normal memory blocks or the at least one system block, wherein a data storage capacity of the at least one system block is less than a data storage capacity of each of the plurality of normal memory blocks.

15 Claims, 12 Drawing Sheets

SEMICONDUCTOR MEMORY DEVICE INCLUDING SYSTEM BLOCK FOR SYSTEM DATA AND METHOD OF OPERATING THE SAME

CROSS-REFERENCE TO RELATED APPLICATION

The present application claims priority under 35 U.S.C. § 119(a) to Korean patent application number 10-2020-0002164, filed on Jan. 7, 2020, in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device and a method of operating the semiconductor memory device.

2. Related Art

Semiconductor devices, in particular, semiconductor memory devices, are classified as volatile memory devices or nonvolatile memory devices.

A nonvolatile memory device has comparatively low write and read speed, but it retains data stored therein even when a supply of power is interrupted. Therefore, the nonvolatile memory device is used to store data to be retained regardless of whether power is supplied. Representative examples of nonvolatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

Flash memory has both advantages of a RAM, in which data is freely programmable and erasable, and advantages of a ROM, in which data stored therein can be retained even when power is interrupted. Flash memory is widely used as a storage medium for portable electronic devices, such as a digital camera, a personal digital assistant (PDA), and an MP3 player.

Flash memory devices may be classified as two-dimensional (2D) semiconductor memory devices, in which memory strings are horizontally formed on a semiconductor substrate, or three-dimensional (3D) semiconductor memory devices, in which memory strings are vertically formed on a semiconductor substrate.

3D semiconductor memory devices, which are devised to overcome a limitation in the degree of integration of 2D semiconductor memory devices, may include a plurality of memory strings which are vertically formed on a semiconductor substrate. Each of the memory strings includes a drain select transistor, memory cells, and a source select transistor which are coupled in series between a bit line and a source line.

SUMMARY

In accordance with an embodiment of the present disclosure, a semiconductor memory device may include a memory cell array including a plurality of normal memory blocks and at least one system block, and a peripheral circuit configured to perform a program operation, a read operation, or an erase operation on the plurality of normal memory blocks or the at least one system block, wherein a data storage capacity of the at least one system block is less than a data storage capacity of each of the plurality of normal memory blocks.

In accordance with an embodiment of the present disclosure, a semiconductor memory device may include a memory cell array including a normal memory block and a system block, and a peripheral circuit configured to perform a program operation, a read operation or an erase operation of the normal memory block and the system block, wherein the system block includes a plurality of memory strings, and part of a plurality of memory cells included in each of the plurality of memory strings are coupled to a common word line.

In accordance with an embodiment of the present disclosure, a method of operating a semiconductor memory device is provided. The method may include providing a memory string including a plurality of memory cells that are coupled in series, wherein part of the plurality of memory cells are coupled to a common word line, programming system data to the part of the plurality of memory cells coupled to the common word line, and simultaneously reading the system data equally programmed to the part of the plurality of memory cells.

DETAILED DESCRIPTION

Specific structural or functional descriptions for embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure will now be described more fully hereinafter with reference to the accompanying drawings, in which embodiments of the present disclosure are shown, so that those skilled in the art can easily practice the technical spirit of the present disclosure.

Some embodiments of the present disclosure are directed to a semiconductor memory device, and a method of operating the semiconductor memory device, which reduce the storage capacity of at least one of a plurality of memory blocks included in the semiconductor memory device, compared to the remaining memory blocks.

Figure 1:
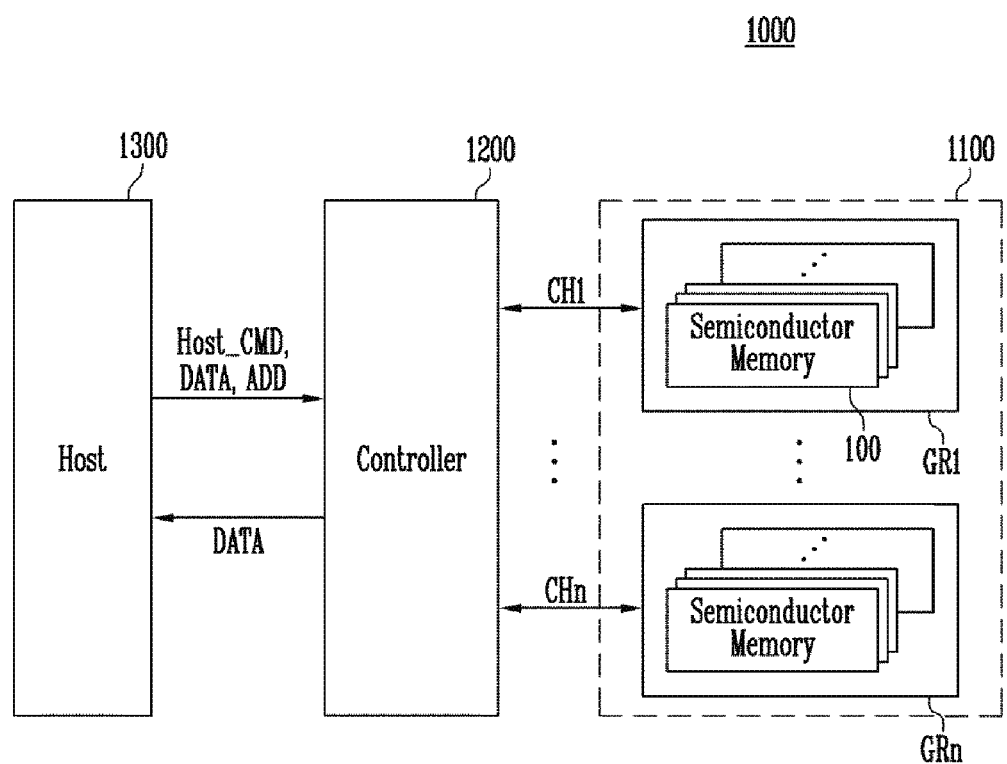
FIG. 1 is a block diagram illustrating a memory system including a semiconductor memory device according to an embodiment of the present disclosure.

FIG. 1 is a block diagram illustrating a memory system including a semiconductor memory device 1100, also referred to as a memory device, according to an embodiment of the present disclosure.

Referring to FIG. 1, a memory system 1000 may include a memory device 1100, a controller 1200, and a host 1300. The memory device 1100 may include a plurality of semiconductor memories (or semiconductor memory devices) 100. The plurality of semiconductor memories 100 may be divided into a plurality of groups GR1 to GRn. In an embodiment of the present disclosure, although the host 1300 is illustrated and described as being included in the memory system 1000, the memory system 1000 may be configured to include only the controller 1200 and the memory device 1100, with the host 1300 being disposed outside the memory system 1000.

In FIG. 1, it is illustrated that the plurality of groups GR1 to GRn of the memory device 1100 individually communicate with the controller 1200 through first to n-th channels CH1 to CHn. Each semiconductor memory 100 will be described in detail later with reference to FIG. 2.

Each of the groups GR1 to GRn may communicate with the controller 1200 through one common channel. The controller 1200 may control the semiconductor memories 100 of the memory device 1100 through the plurality of channels CH1 to CHn.

In an embodiment of the present disclosure, each of the plurality of semiconductor memories 100 included in the memory device 1100 may include a plurality of memory blocks. At least one of the plurality of memory blocks may be defined as a system block, and the remaining memory blocks may be defined as normal memory blocks. The system block may store system data, which may contain setting information required to drive the memory system 1000. For example, the system data may be data, such as a bootloader used by firmware of the memory system 1000, address mapping data, and option parameter data. In an embodiment of the present disclosure, the data storage capacity of the system block may be designed to be lower than that of the normal memory blocks.

The controller 1200 is coupled between the host 1300 and the memory device 1100. The controller 1200 may access the memory device 1100 in response to a request from the host 1300. For example, the controller 1200 may control a read operation, a write operation, an erase operation, and a background operation of the memory device 1100 in response to a host command Host_CMD received from the host 1300. The host 1300 may transmit an address ADD and data DATA, together with the host command Host_CMD, during a write operation, and may transmit an address ADD, together with the host command Host_CMD, during a read operation. During the write operation, the controller 1200 may transmit the command corresponding to the write operation and the data DATA to be programmed to the memory device 1100. During the read operation, the controller 1200 may transmit the command corresponding to the read operation to the memory device 1100, receive read data DATA from the memory device 1100, and transmit the received data DATA to the host 1300. The controller 1200 may provide an interface between the memory device 1100 and the host 1300. The controller 1200 may run firmware for controlling the memory device 1100.

The host 1300 may include portable electronic devices, such as a computer, a personal digital assistant (PDA), a portable multimedia player (PMP), an MP3 player, a camera, a camcorder, and a mobile phone. The host 1300 may request the write operation, the read operation, and the erase operation of the memory system 1000 through the host command Host_CMD. The host 1300 may transmit the host command Host_CMD corresponding to the write operation, the data DATA, and the address ADD to the controller 1200 so as to perform the write operation of the memory device 1100, and may transmit the host command Host_CMD corresponding to the read operation and the address ADD to the controller 1200 so as to perform the read operation. Here, the address ADD may be the logical address of the data.

The controller 1200 and the memory device 1100 may be integrated into a single semiconductor memory device. In an embodiment, the controller 1200 and the memory device 1100 may be integrated into a single semiconductor memory device to form a memory card. For example, the controller 1200 and the memory device 1100 may be integrated into a single semiconductor memory device to form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), or a universal flash storage (UFS).

In an embodiment, the memory system 1000 may be provided as one of various elements of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1100 or the memory system 1000 may be mounted as various types of packages. For example, the memory device 1100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 2:
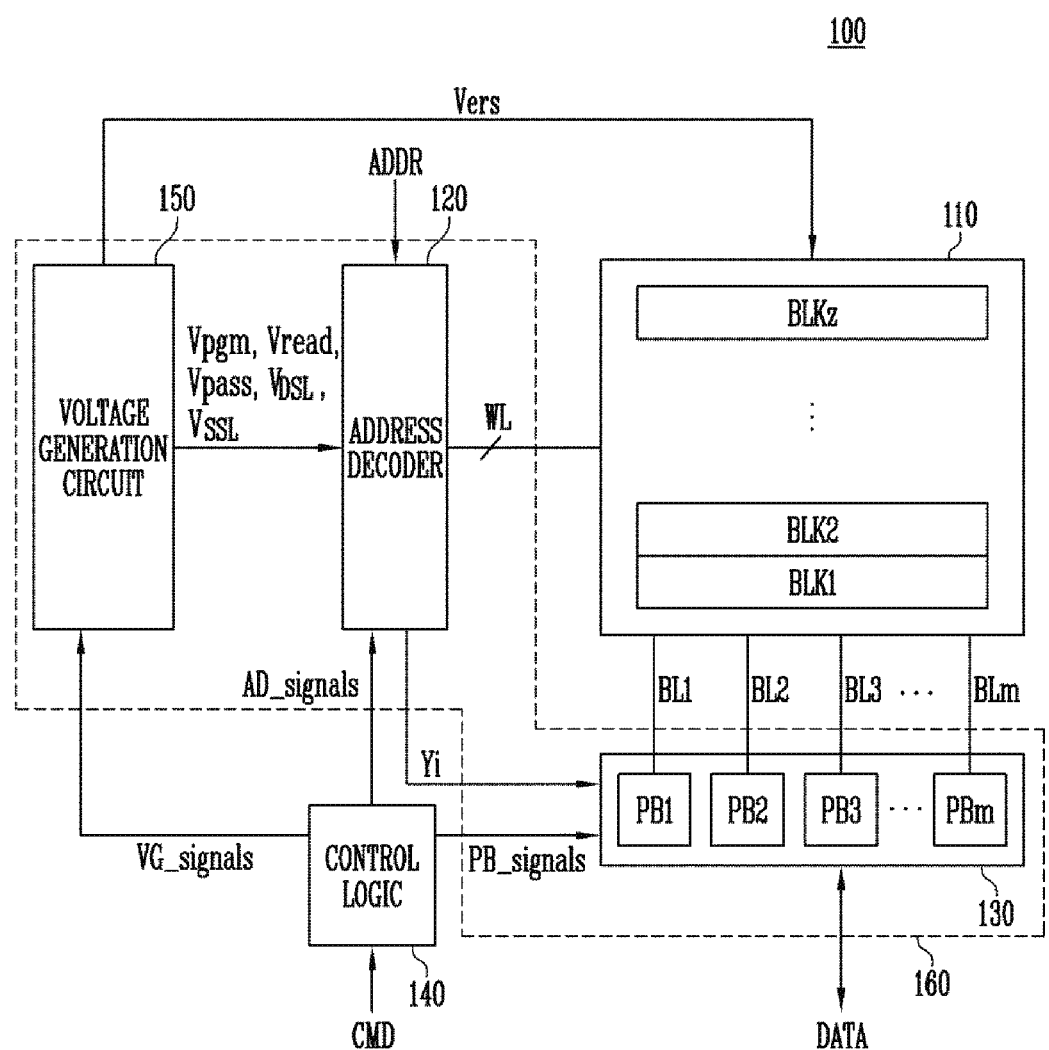
FIG. 2 is a block diagram illustrating a semiconductor memory according to an embodiment of the present disclosure.

FIG. 2 is a diagram illustrating a semiconductor memory 100 according to an embodiment of the present disclosure.

Referring to FIG. 2, the semiconductor memory 100 may include a memory cell array 110, an address decoder 120, a read and write circuit 130, control logic 140, and a voltage generation circuit 150. The address decoder 120, the read and write circuit 130, and the voltage generation circuit 150 may be defined as a peripheral circuit 160 which performs a program operation, a read operation or an erase operation on the memory cell array 110.

The memory cell array 110 includes a plurality of memory blocks BLK1 to BLKz. At least one of the plurality of memory blocks BLK1 to BLKz may be defined as a system block, and the remaining memory blocks may be defined as normal memory blocks. In an embodiment of the present disclosure, a description will be made on the assumption that the memory block BLK1 is defined as a system block and the memory blocks BLK2 to BLKz are defined as normal memory blocks.

The plurality of memory blocks BLK1 to BLKz are coupled to the address decoder 120 through word lines WL. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells. Memory cells coupled to one word line, among the plurality of memory cells, may be defined as one page. That is, each of the memory blocks BLK1 to BLKz may be composed of a plurality of pages. The number of pages included in the system block BLK1 may be less than the number of pages included in each of the normal memory blocks BLK2 to BLKz.

Each of the memory blocks BLK1 to BLKz of the memory cell array 110 includes a plurality of memory strings. Each of the memory strings includes a drain select transistor, a plurality of memory cells, and a source select transistor which are coupled in series between a bit line and a source line. Further, each of the memory strings may include respective pass transistors between the source select transistor and the memory cells and between the drain select transistor and the memory cells, and may further include a pipe gate transistor between the memory cells. The number of memory strings included in the system block BLK1 may be less than the number of memory strings included in each of the normal memory blocks BLK2 to BLKz.

The memory cell array 110 will be described in detail later.

The address decoder 120 is coupled to the memory cell array 110 through the word lines WL. The address decoder 120 may be operated in response to address decoder control signals AD_signals generated by the control logic 140. The address decoder 120 receives addresses ADDR through an input/output buffer (not illustrated) provided in the semiconductor memory 100.

During a program operation or a read operation, the address decoder 120 may decode a row address, among the received addresses ADDR, and may apply a plurality of operating voltages including a program voltage Vpgm or a read voltage Vread, a pass voltage Vpass, a drain select line voltage $V_{DSL}$, and a source select line voltage $V_{SSL}$, which are generated by the voltage generation circuit 150, to the plurality of memory cells, drain select transistors, and source select transistors of the memory cell array 110, based on the decoded row address.

The address decoder 120 may decode a column address, among the received addresses ADDR. The address decoder 120 may transmit a decoded column address Yi to the read and write circuit 130.

The addresses ADDR received in a program operation or a read operation include a block address, a row address, and a column address. The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 may include a plurality of page buffers PB1 to PBm. The plurality of page buffers PB1 to PBm may be coupled to the memory cell array 110 through the bit lines BL1 to BLm. During a program operation, each of the page buffers PB1 to PBm may temporarily store data DATA to be programmed, received from the controller 1200 of FIG. 1, and may control the potential level of a corresponding one of the bit lines BL1 to BLm in accordance with the temporarily stored data DATA. Further, during a read operation, the read and write circuit 130 may perform the read operation by sensing the potential levels or the amounts of current of the bit lines BL1 to BLm, and may output the read data DATA to the controller 1200 of FIG. 1.

The read and write circuit 130 may be operated in response to page buffer control signals PB_signals output from the control logic 140.

In an embodiment, the read and write circuit 130 may include page buffers (or page registers), a column select circuit, etc.

During a program operation, the voltage generation circuit 150 may generate the plurality of operating voltages including the program voltage Vpgm, the pass voltage Vpass, the drain select line voltage $V_{DSL}$, and the source select line voltage $V_{SSL}$ under the control of voltage generation circuit control signals VG_signals output from the control logic 140, and may output the plurality of operating voltages to the address decoder 120. During a read operation, the voltage generation circuit 150 may generate a plurality of operating voltages including the read voltage Vread, the pass voltage Vpass, the drain select line voltage $V_{DSL}$, and the source select line voltage $V_{SSL}$ in response to voltage generation circuit control signals VG_signals output from the control logic 140, and may output the plurality of operating voltages to the address decoder 120.

In addition, during an erase operation, the voltage generation circuit 150 may generate an erase voltage Vera and provide the erase voltage Vera to the memory cell array 110.

The control logic 140 may be coupled to the address decoder 120, the read and write circuit 130, and the voltage generation circuit 150. The control logic 140 may receive a command CMD through an input/output buffer (not shown) of the semiconductor memory 100. The control logic 140 may control the overall operation of the semiconductor memory 100 in response to the command CMD. For example, the control logic 140 may receive the command CMD corresponding to the program operation or the read operation, and may generate and output address decoder control signals AD_signals for controlling the address decoder 120, page buffer control signals PB_signals for controlling the read and write circuit 130, and voltage generation circuit control signals VG_signals for controlling the voltage generation circuit 150 in response to the received command CMD. The control logic 140 may be implemented as hardware, software, or a combination of hardware and software. For example, the control logic 140 may be a control logic circuit operating in accordance with an algorithm and/or a processor executing control logic code.

Figure 3:
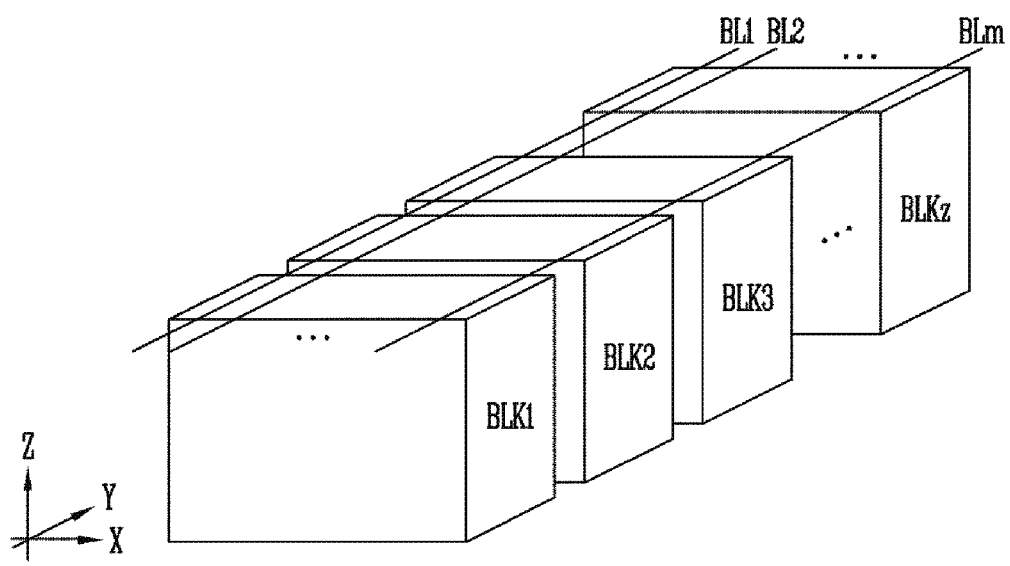
FIG. 3 is a diagram illustrating memory blocks having a 3D structure.

FIG. 3 is a diagram illustrating memory blocks BLK1 to BLKz having a 3D structure.

Referring to FIG. 3, the memory blocks BLK1 to BLKz having a 3D structure may be arranged to be spaced apart from each other along a direction Y in which bit lines BL1 to BLm extend. For example, the first to z-th memory blocks BLK1 to BLKz may be arranged to be spaced apart from each other along a second direction Y, and each of the first to z-th memory blocks BLK1 to BLKz may include a plurality of memory cells stacked along a third direction Z. A description will be made later with reference to subsequent drawings on the assumption that the memory block BLK1 is defined as a system block and the remaining memory blocks BLK2 to BLKz are defined as normal memory blocks.

Figure 4:
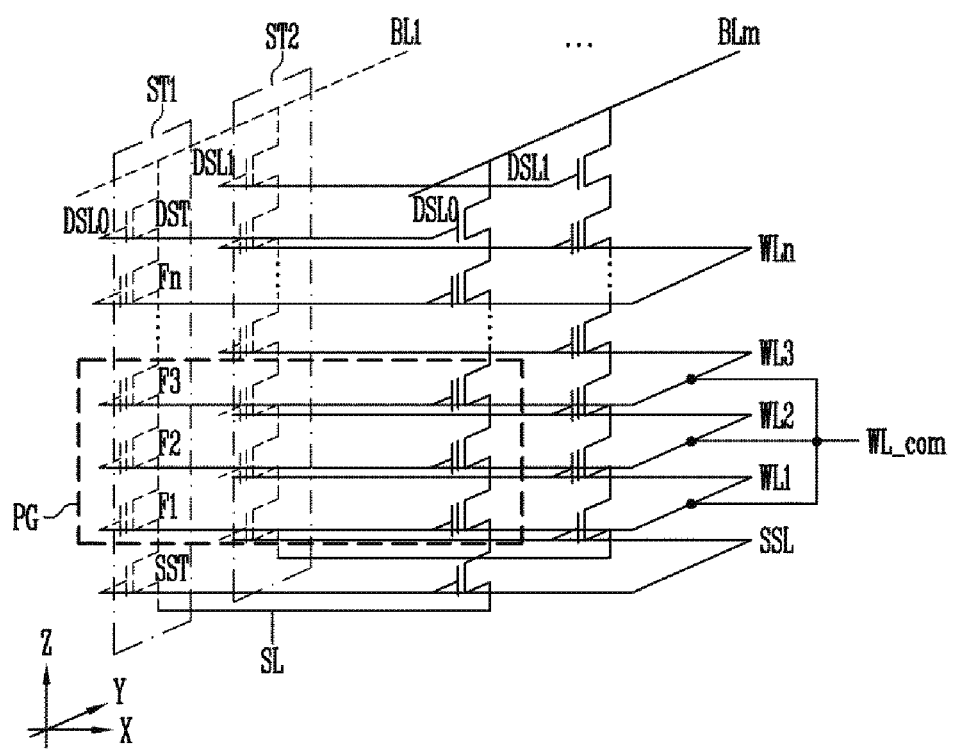
FIG. 4 is a circuit diagram illustrating a system block, among the memory blocks illustrated in FIG. 3.

FIG. 4 is a circuit diagram illustrating a system block, among the memory blocks BLK1 to BLKz illustrated in FIG. 3.

Figure 5:
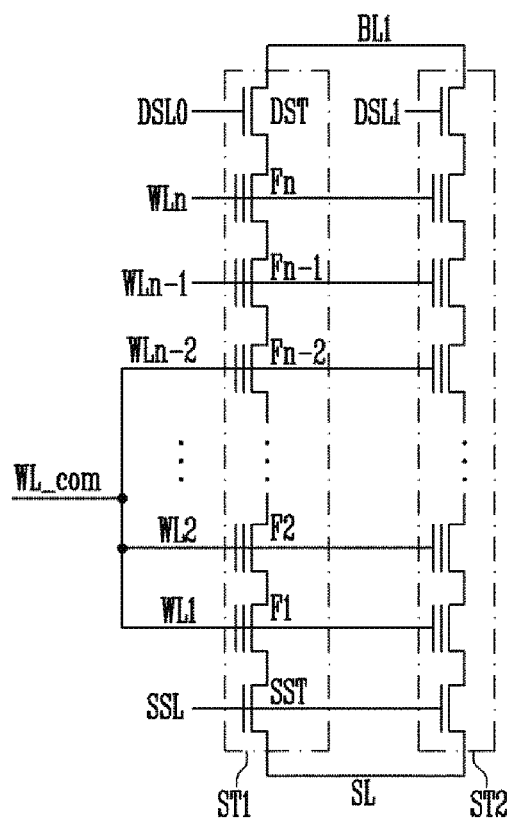
FIG. 5 is a circuit diagram illustrating memory strings illustrated in FIG. 4.

FIG. 5 is a circuit diagram illustrating memory strings illustrated in FIG. 4.

Referring to FIGS. 4 and 5, the system block (e.g., BLK1 of FIG. 3) includes a plurality of memory strings ST1 and ST2. For example, the system block may include a first memory string ST1 and a second memory string ST2 which are coupled to each of a plurality of bit lines BL1 to BLm.

Each of the first memory string ST1 and the second memory string ST2 may include a source select transistor SST, memory cells F1 to Fn (where n is a positive integer), and a drain select transistor DST which are coupled in series between a source line SL and the first bit line BL1. Gates of the source select transistors SST included in the first memory string ST1 and the second memory string ST2 coupled to one bit line (e.g., BL1) may be coupled to the same source select line SSL, and gates of the drain select transistors DST included in the first memory string ST1 and the second memory string ST2 coupled to one bit line (e.g., BL1) may be coupled to different drain select lines DSL0 and DSL1. Gates of the drain select transistors DST which are included in different first memory strings ST1 respectively coupled to the different bit lines BL1 to BLm may be coupled to the same drain select line DSL0, and gates of the source select transistors SST which are included in different first memory strings ST1 respectively coupled to the different bit lines BL1 to BLm may be coupled to the same source select line SSL. Gates of the drain select transistors DST which are included in different second memory strings ST2 respectively coupled to the different bit lines BL1 to BLm may be coupled to the same drain select line DSL1, and gates of the source select transistors SST which are included in different second memory strings ST2 respectively coupled to the different bit lines BL1 to BLm may be coupled to the same source select line SSL. Although the system block BLK1 according to an embodiment of the present disclosure is illustrated and described such that two memory strings are coupled to each bit line, the present disclosure is not limited thereto, but at least one memory string may be coupled to each bit line, and the number of memory strings coupled to one bit line in the system block BLK1 may be less than the number of memory strings coupled to one bit line in each of the normal memory blocks BLK2 to BLKz of FIG. 3.

Gates of the memory cells F1 to Fn may be coupled to the word lines WL1 to WLn, and some word lines (e.g., WL1 to WLn-2) of the word lines WL1 to WLn may be coupled to a common word line WL_com.

Memory cells coupled to the same word line, among memory cells included in the memory strings which share one drain select line DSL0 or DSL1, may form one page PG. Among the first memory strings ST1 or the second memory strings ST2 coupled to the first bit line BL1 to the m-th bit line BLm, a group of memory cells coupled in a first direction X to the same word line may be referred to as a 'page PG'. Here, the term "page" means a physical page. For example, memory cells Fn coupled to the word line WLn, among the memory cells included in the first memory strings which share the drain select line DSL0, may form one page PG. Among the memory cells Fn coupled in common to the word line WLn, memory cells arranged in the second direction Y may be divided into different pages. Memory cells F1 to Fn-2 coupled to the word lines WL1 to WLn-2 which are coupled to the common word line WL_com, among the memory cells included in the first memory strings which share the drain select line DSL0, may form one page PG. That is, in the system block BLK1, some word lines (e.g., WL1 to WLn-2) of the word lines WL1 to WLn are coupled to the common word line WL_com, and the memory cells corresponding to the common word line WL_com are grouped as one page, thus reducing the number of pages included in the system block BLK1. For example, the number of pages included in the system block BLK1 may be less than the number of pages included in each of the normal memory blocks BLK2 to BLKz of FIG. 3.

Although, in the drawing, one source select transistor SST and one drain select transistor DST are illustrated as being included in one memory string, a plurality of source select transistors SST and a plurality of drain select transistors DST may be included in one memory string depending on the semiconductor memory. Also, dummy cells may be included between the source select transistor SST, the memory cells F1 to Fn, and the drain select transistor DST depending on the semiconductor memory. The dummy cells do not store user data, unlike the normal memory cells F1 to Fn, but may be used to improve the electrical characteristics of each memory string ST. However, because the dummy cells are not essential components in the present embodiment, a detailed description thereof will be omitted here.

Figure 6:
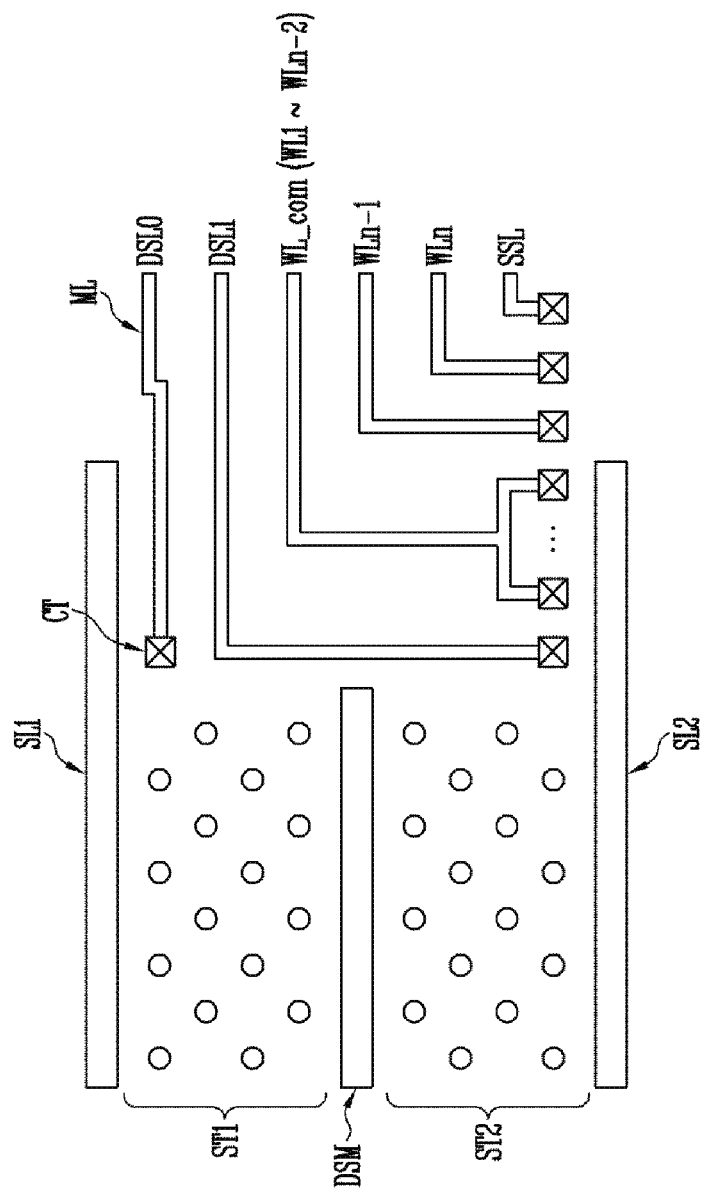
FIG. 6 is a diagram illustrating the system block illustrated in FIG. 4.

FIG. 6 is a diagram illustrating the system block illustrated in FIG. 4.

Referring to FIG. 6, first memory strings ST1 and second memory strings ST2 included in the system block may be regularly arranged on a semiconductor substrate between first and second slits SL1 and SL2. In an area between the first memory strings ST1 and the second memory strings ST2, a drain select line separation structure DSM may be formed, by which gate lines of the drain select transistors of the first memory strings ST1 and the second memory strings ST2 may be isolated from each other.

At first ends of the first memory strings ST1 and the second memory strings ST2, a plurality of contacts CT may be formed, and may be coupled to a first drain select line DSL0, a second drain select line DSL1, a plurality of word lines WL1 to WLn, and a source select line SSL through metal lines ML. Some word lines WL1 to WLn-2 of the plurality of word lines WL1 to WLn may be electrically coupled to a common word line WL_com.

A program operation and a read operation of the system block according to the embodiment of the present disclosure will be described below with reference to FIGS. 2 to 6.

The program operation and the read operation of the system block BLK1 may be performed on a page basis.

During the program operation of the system block BLK1, the control logic 140 may receive a command CMD corresponding to the program operation of the system block BLK1, and may generate and output address decoder control signals AD_signals, page buffer control signals PB_signals, and voltage generation circuit control signals VG_signals, which are required so as to control the peripheral circuit 160 so that the program operation on the system block BLK1 is performed in response to the received command CMD.

During the program operation of the system block BLK1, the read and write circuit 130 may receive and temporarily store system data DATA in response to the page buffer control signals PB_signals output from the control logic 140, and may control the potential levels of the bit lines BL1 to BLm depending on the temporarily stored system data DATA. The system data may include pieces of setting information required so as to drive a memory system, and may be, for example, data, such as a bootloader used by firmware of the memory system, address mapping data, and option parameter data.

During the program operation of the system block BLK1, the voltage generation circuit 150 may generate a plurality of operating voltages including a program voltage Vpgm, a pass voltage Vpass, a drain select line voltage $V_{DSL}$, and a source select line voltage $V_{SSL}$ in response to the voltage generation circuit control signals VG_signals output from the control logic 140, and may output the plurality of operating voltages to the address decoder 120.

During the program operation of the system block BLK1, the address decoder 120 may apply the drain select line voltage $V_{DSL}$ generated by the voltage generation circuit 150 to a selected drain select line (e.g., DSL0) of the system block BLK1, may apply the program voltage Vpgm to a word line selected from among a plurality of word lines WL1 to WLn coupled to the system block BLK1, and may apply the pass voltage Vpass generated by the voltage generation circuit 150 to unselected word lines that are the remaining word lines other than the selected word line, among the plurality of word lines WL1 to WLn.

Here, when the selected word line corresponding to the selected page is a common word line WL_com, the program voltage Vpgm may be applied, together with required voltages, to the word lines (e.g., WL1 to WLn-2) coupled to the common word line WL_com, and thus the memory cells F1 to Fn-2 of the first memory strings ST1 coupled to the word lines WL1 to WLn-2 may be simultaneously programmed. That is, some memory cells F1 to Fn-2 included in the same memory string may be programmed to the same program state. Therefore, among the memory cells included in the same memory string, memory cells, the gates of which are coupled to the common word line WL_com, may be programmed as a single memory cell.

During the read operation of the system block BLK1, the control logic 140 may receive a command CMD corresponding to the read operation of the system block BLK1, and may generate and output address decoder control signals AD_signals, page buffer control signals PB_signals, and voltage generation circuit control signals VG_signals, which are required so as to control the peripheral circuit 160 so that the read operation on the system block BLK1 is performed in response to the received command CMD.

During the read operation of the system block BLK1, the voltage generation circuit 150 may generate a plurality of operating voltages including a read voltage Vread, a pass voltage Vpass, a drain select line voltage $V_{DSL}$, and a source select line voltage $V_{SSL}$ in response to the voltage generation circuit control signals VG_signals output from the control logic 140, and may output the plurality of operating voltages to the address decoder 120.

During the read operation of the system block BLK1, the address decoder 120 may apply the drain select line voltage $V_{DSL}$ generated by the voltage generation circuit 150 to a selected drain select line (e.g., DSL0) of the system block BLK1, may apply the read voltage Vread to a word line selected from among a plurality of word lines WL1 to WLn coupled to the system block BLK1, and may apply the pass voltage Vpass generated by the voltage generation circuit 150 to unselected word lines that are the remaining word lines other than the selected word line, among the plurality of word lines WL1 to WLn.

Here, when the selected word line corresponding to the selected page is a common word line WL_com, the read voltage Vread may be applied, together with required voltages, to the word lines (e.g., WL1 to WLn-2) coupled to the common word line WL_com, and thus the memory cells F1 to Fn-2 of the first memory strings ST1 coupled to the word lines WL1 to WLn-2 may be simultaneously read. Because some memory cells F1 to Fn-2 included in the same memory string have been programmed to the same program state during a previous program operation, they may be read as the same program state during the read operation. Therefore, among the memory cells included in the same memory string, memory cells, the gates of which are coupled to the common word line WL_com, may be read like a single memory cell.

During the read operation of the system block BLK1, the read and write circuit 130 may sense the potential levels or the amounts of current of the bit lines BL1 to BLm in response to the page buffer control signals PB_signals output from the control logic 140, and may then read the system data DATA.

Figure 7:
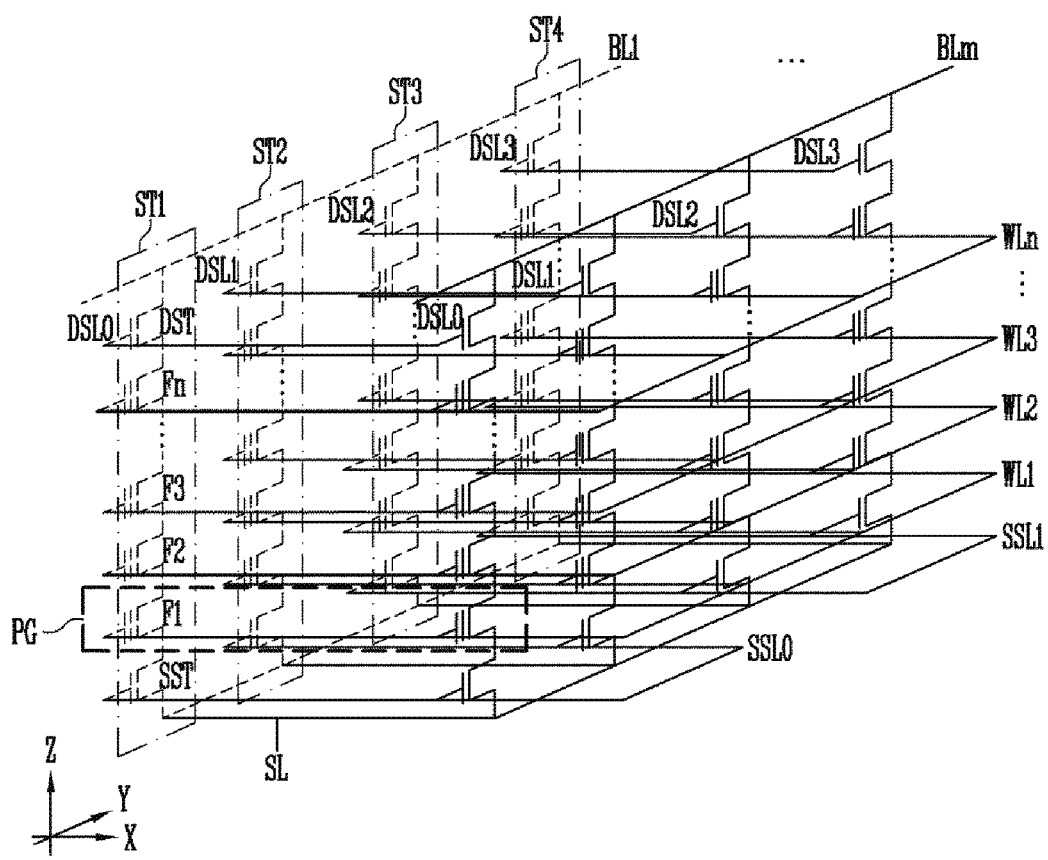
FIG. 7 is a circuit diagram illustrating a normal memory block, among the memory blocks illustrated in FIG. 3.

FIG. 7 is a circuit diagram illustrating a normal memory block, among the memory blocks BLK1 to BLKz illustrated in FIG. 3.

Figure 8:
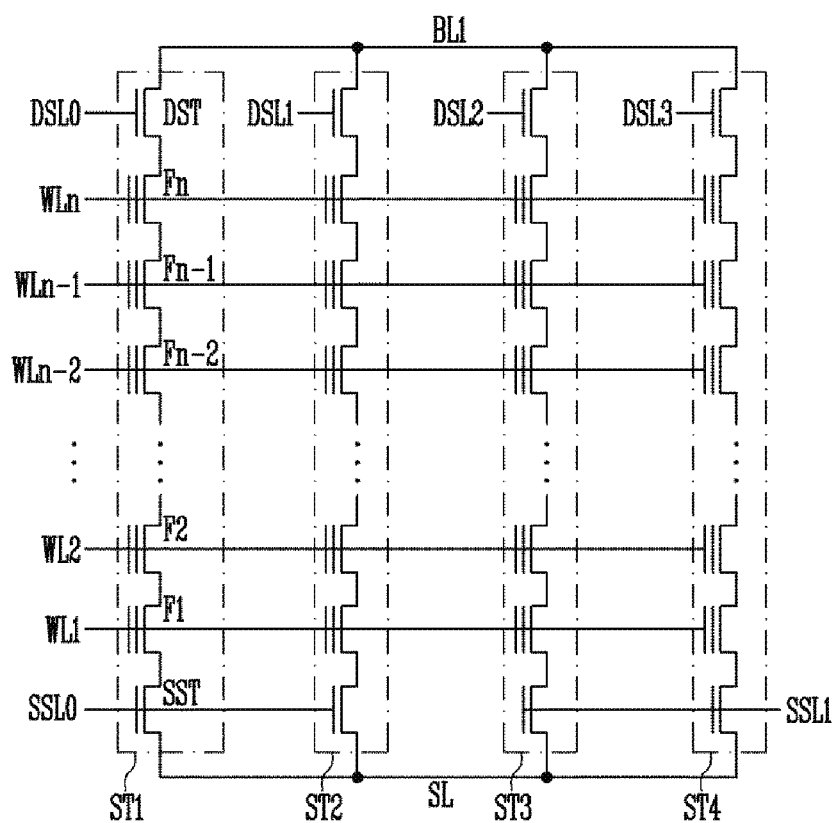
FIG. 8 is a circuit diagram illustrating memory strings illustrated in FIG. 7.

FIG. 8 is a circuit diagram illustrating the memory strings illustrated in FIG. 7.

The normal memory blocks BLK2 to BLKz of FIG. 3 may be designed in the same structure.

Referring to FIGS. 7 and 8, each of the normal memory blocks BLK2 to BLKz of FIG. 3 may include a plurality of memory strings ST1 to ST4. For example, each normal memory block may include a first memory string ST1, a second memory string ST2, a third memory string ST3, and a fourth memory string ST4, which are coupled to each of a plurality of bit lines BL1 to BLm. That is, a plurality of memory strings ST1 to ST4 may be coupled to one bit line.

Each of the memory strings ST1 to ST4 may be coupled between the bit lines BL1 to BLm and a source line SL.

The first memory string ST1 coupled between the first bit line BL1 and the source line SL will be described by way of example. The first memory string ST1 may include a source select transistor SST, memory cells F1 to Fn (where n is a positive integer), and a drain select transistor DST which are coupled in series between the source line SL and the first bit line BL1. The first memory strings ST1 coupled to different bit lines BL1 to BLm may share a drain select line (e.g., DSL0), a plurality of word lines WL1 to WLn, and a source select line SSL0.

The source select transistor SST included in the second memory string ST2 coupled between the first bit line BL1 and the source line SL may share the same source select line SSL0 with the first memory string ST1, and the drain select transistor DST included in the second memory string ST2 may correspond to the drain select line DSL1 differing from the drain select line DSL0 corresponding to the first memory string ST1.

The source select transistor SST included in the third memory string ST3 coupled between the first bit line BL1 and the source line SL may correspond to a source select line SSL1 differing from the source select line SSL0 corresponding to the first memory string ST1 and the second memory string ST2, and the drain select transistor DST included in the third memory string ST3 may correspond to a drain select line DSL2 differing from the drain select lines DSL0 and DSL1 corresponding to the first memory string ST1 and the second memory string ST2.

The source select transistor SST included in the fourth memory string ST4 coupled between the first bit line BL1 and the source line SL may share the same source select line SSL1 with the third memory string ST3, and the drain select transistor DST included in the fourth memory string ST4 may correspond to a drain select line DSL3 differing from the drain select lines DSL0, DSL1, and DSL2 corresponding to the first memory string ST1, the second memory string ST2, and the third memory string ST3.

For example, of the source select transistors SST, source select transistors that are adjacent to each other in a second direction Y may be coupled to the same source select line. For example, assuming that the source select transistors SST are sequentially arranged along the second direction Y, the gates of the source select transistors SST which are arranged from the first source select transistor SST in a first direction X and which are included in different memory strings, and the gates of source select transistors SST which are arranged from the second source select transistor SST in the first direction X and which are included in different memory strings may be coupled to the source select line SSL0. Also, the gates of the source select transistors SST which are arranged from the third source select transistor SST in the first direction X and which are included in different memory strings, and the gates of source select transistors SST which are arranged from the fourth source select transistor SST in the first direction X and which are included in different memory strings may be coupled to the source select line SSL1.

The gates of the memory cells F1 to Fn may be coupled to the word lines WL1 to WLn, and the gates of the drain select transistors DST may be coupled to any one of the first to fourth drain select lines DSL0 to DSL3.

The gates of the transistors arranged in the first direction X, among the drain select transistors DST, may be coupled in common to the same drain select line (e.g., DSL0), but the gates of the transistors arranged in the second direction Y may be coupled to different drain select lines DSL0 to DSL3. For example, assuming that drain select transistors DST are sequentially arranged along the second direction Y, the gates of the drain select transistors DST which are arranged from the first drain select transistor DST in the first direction X and which are included in other memory strings may be coupled to the drain select line DSL0. The drain select transistors DST, arranged from the drain select transistors DST coupled to the drain select line DSL0 in the second direction Y, may be sequentially coupled to the second to fourth drain select lines DSL1 to DSL3.

The memory cells coupled to the same word line may form one page PG. Here, the term "page" means a physical page. For example, among the first to fourth memory strings ST1 to ST4 coupled to the first bit line BL1 to the m-th bit line BLm, a group of memory cells coupled in the first direction X to the same word line may be referred to as a 'page PG'. For example, among the first memory cells F1 coupled in common to the first word line WL1, memory cells arranged in the second direction Y may be divided into different pages. Therefore, when the drain select line DSL0 is a selected drain select line and the word line WL1 is a selected word line, a page coupled to the drain select line DSL0, among a plurality of pages PG coupled to the word line WL1, may be the selected page. The pages which are coupled in common to the word line WL1, but are coupled to unselected drain select lines DSL1 to DSL3 may be unselected pages.

Although, in the drawing, one source select transistor SST and one drain select transistor DST are illustrated as being included in one memory string, a plurality of source select transistors SST and a plurality of drain select transistors DST may be included in one memory string depending on the semiconductor memory. Also, dummy cells may be included between the source select transistor SST, the memory cells F1 to Fn, and the drain select transistor DST depending on the semiconductor memory. The dummy cells do not store user data, unlike the normal memory cells F1 to Fn, but may be used to improve the electrical characteristics of each memory string. However, because the dummy cells are not essential components in the present embodiment, a detailed description thereof will be omitted here.

As described above, in the embodiment of the present disclosure, the number of memory strings coupled to one bit line in the system block BLK1 may be less than the number of memory strings coupled to one bit line in each of the normal memory blocks BLK2 to BLKz. Further, in the system block BLK1, some word lines (e.g., WL1 to WLn-2) of the word lines WL1 to WLn are coupled to the common word line WL_com, and memory cells corresponding to the common word line WL_com are grouped as one page, and thus the number of pages included in the system block BLK1 may be less than the number of pages included in each of the normal memory blocks BLK2 to BLKz. Due thereto, the data storage capacity of the system block BLK1 may be less than that of each of the normal memory blocks BLK2 to BLKz, and the density of the system block BLK1 may be lower than that of each of the normal memory blocks BLK2 to BLKz.

Figure 9:
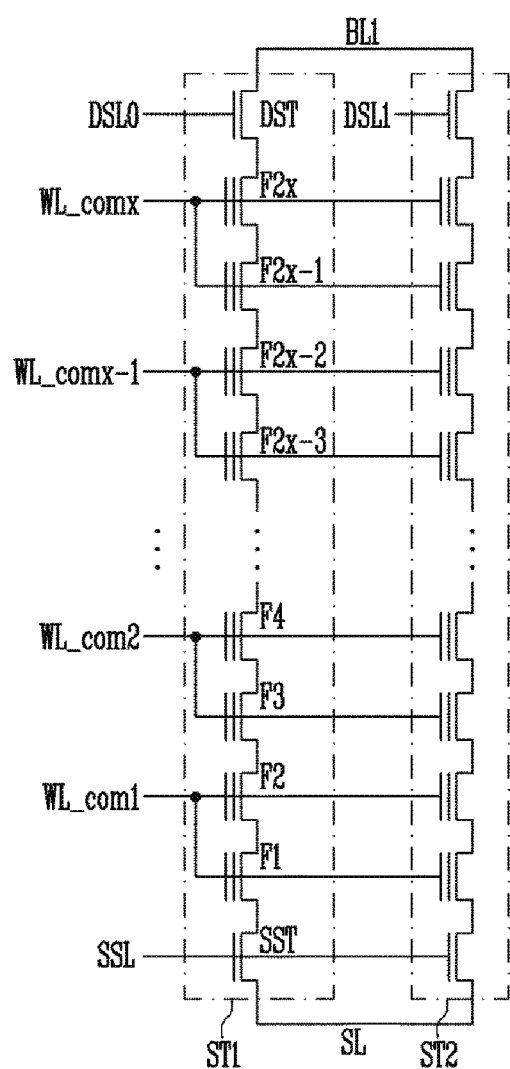
FIG. 9 is a circuit diagram illustrating an embodiment of the system block, among the memory blocks illustrated in FIG. 3.

FIG. 9 is a circuit diagram illustrating an embodiment of the system block, among the memory blocks BLK1 to BLKz illustrated in FIG. 3.

The system block includes first memory strings ST1 and second memory strings ST2 coupled to a plurality of bit lines BL1 to BLm, as illustrated in FIG. 4, but, in FIG. 9, for convenience of description, the first memory string ST1 and the second memory string ST2 coupled to one bit line (e.g., BL1) will be described.

The first memory string ST1 and the second memory string ST2 are coupled in parallel between a bit line BL1 and a source line SL, and each of the first memory string ST1 and the second memory string ST2 may include a drain select transistor DST, a plurality of memory cells F1 to F2$x$, and a source select transistor SST which are coupled in series. The first memory string ST1 and the second memory string ST2 share a plurality of common word lines WL_com1 to WL_com$x$ coupled to gates of the plurality of memory cells F1 to F2$x$ and a source select line SSL coupled to a gate of the source select transistor SST. A gate of the drain select transistor DST in the first memory string ST1 may be coupled to a drain select line DSL0, and a gate of the drain select transistor DST in the second memory string ST2 may be coupled to a drain select line DSL1.

Also, the plurality of memory cells F1 to F2x included in one memory string may be grouped into a plurality of cell groups, each of which may correspond to one common word line. For example, as illustrated in FIG. 9, the memory cells F1 and F2 may correspond to the common word line WL_com1, the memory cells F3 and F4 may correspond to the common word line WL_com2, the memory cells F2x-3 and F2x-2 may correspond to the common word line WL_comx-1, and the memory cells F2x-1 and F2x may correspond to the common word line WL_comx. Although, in an embodiment of the present disclosure, two memory cells are illustrated as corresponding to one common word line, two or more memory cells may correspond to one common word line.

Although the first memory string ST1 and the second memory string ST2 coupled to one bit line BL1 have been described with reference to FIG. 9, the same memory strings as the foregoing first and second memory strings ST1 and ST2 may be coupled to each of the plurality of bit lines BL2 to BLm, as illustrated in FIG. 4.

Figure 10:
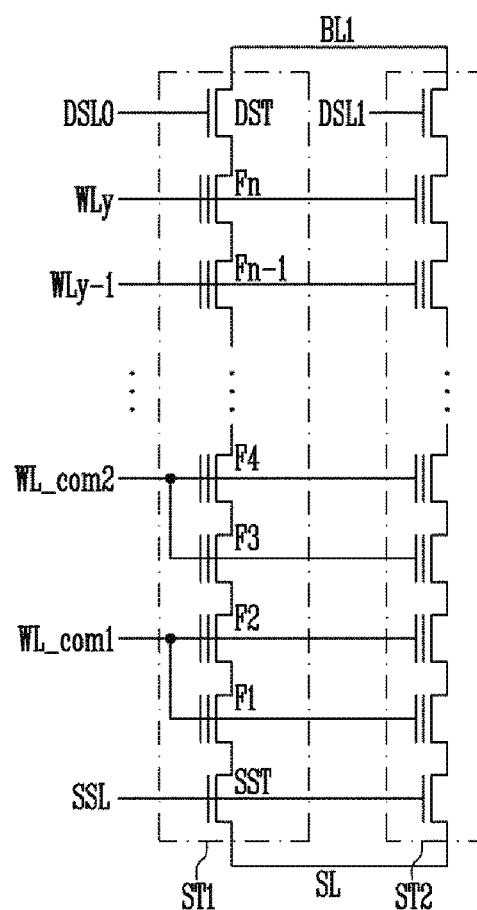
FIG. 10 is a circuit diagram illustrating an embodiment of the system block, among the memory blocks illustrated in FIG. 3.

FIG. 10 is a circuit diagram illustrating an embodiment of the system block, among the memory blocks BLK1 to BLKz illustrated in FIG. 3.

The system block includes first memory strings ST1 and second memory strings ST2 coupled to a plurality of bit lines BL1 to BLm, as illustrated in FIG. 4, but, in FIG. 10, for convenience of description, the first memory string ST1 and the second memory string ST2 coupled to one bit line (e.g., BL1) will be described.

The first memory string ST1 and the second memory string ST2 are coupled in parallel between a bit line BL1 and a source line SL, and each of the first memory string ST1 and the second memory string ST2 may include a drain select transistor DST, a plurality of memory cells F1 to Fn, and a source select transistor SST which are coupled in series. The first memory string ST1 and the second memory string ST2 share a plurality of common word lines WL_com1 and WL_com2 and a plurality of word lines WLy-1 and WLy, which are coupled to gates of the plurality of memory cells F1 to Fn, and a source select line SSL, which is coupled to a gate of the source select transistor SST. A gate of the drain select transistor DST in the first memory string ST1 may be coupled to a drain select line DSL0, and a gate of the drain select transistor DST in the second memory string ST2 may be coupled to a drain select line DSL1.

Also, some of the plurality of memory cells F1 to Fn included in one memory string may be grouped into a plurality of cell groups, each of which may correspond to one common word line. For example, as illustrated in FIG. 10, the memory cells F1 and F2 may correspond to the common word line WL_com1, and the memory cells F3 and F4 may correspond to the common word line WL_com2. Also, each of the remaining memory cells, which are not included in the plurality of cell groups, may correspond to one word line. For example, as illustrated in FIG. 10, the memory cell Fn-1 may correspond to the word line WLy-1, and the memory cell Fn may correspond to the word line WLy. That is, unlike the memory strings illustrated in FIG. 9, only some of the memory cells included in the memory string illustrated in FIG. 10 may be grouped into cell groups, each including at least two memory cells, wherein one common word line may be coupled to each cell group, and each of the remaining memory cells may be coupled to one word line.

Although the first memory string ST1 and the second memory string ST2 coupled to one bit line BL1 have been described with reference to FIG. 10, the same memory strings as the foregoing first and second memory strings ST1 and ST2 may be coupled to each of the plurality of bit lines BL2 to BLm, as illustrated in FIG. 4.

Figure 11:
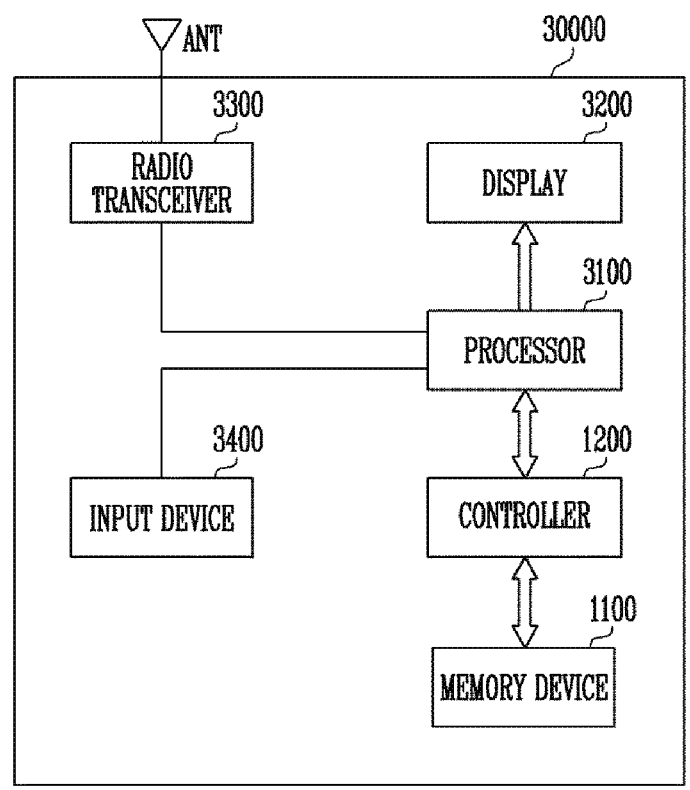
FIG. 11 is a diagram illustrating an embodiment of a memory system.

FIG. 11 is a diagram illustrating an embodiment of a memory system.

Referring to FIG. 11, a memory system 30000 may be implemented as a cellular phone, a smartphone, a tablet PC, a personal digital assistant (PDA) or a wireless communication device. The memory system 30000 may include a memory device 1100 and a controller 1200 that is capable of controlling the operation of the memory device 1100. The controller 1200 may control a data access operation of the memory device 1100, for example, a program operation, an erase operation or a read operation, under the control of a processor 3100.

Data programmed to the memory device 1100 may be output via a display 3200 under the control of the controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the controller 1200 or the display 3200. The controller 1200 may program the signals processed by the processor 3100 to the memory device 1100. Further, the radio transceiver 3300 may convert signals output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 so that data output from the controller 1200, data output from the radio transceiver 3300, or data output from the input device 3400 is output via the display 3200.

In an embodiment, the controller 1200 capable of controlling the operation of the memory device 1100 may be implemented as a part of the processor 3100 or as a chip provided separately from the processor 3100. Further, the controller 1200 may be implemented through the example of the controller 1200 illustrated in FIG. 1, and the memory device 1100 may be implemented through the example of the memory device 1100 illustrated in FIG. 1.

Figure 12:
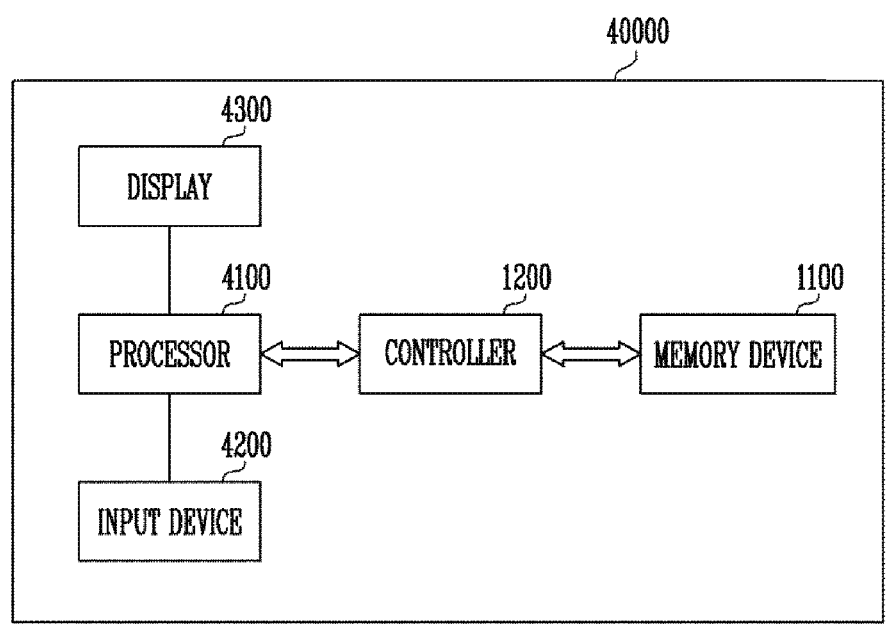
FIG. 12 is a diagram illustrating an embodiment of a memory system.

FIG. 12 is a diagram illustrating an embodiment of a memory system 40000.

Referring to FIG. 12, the memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 and a controller 1200 that is capable of controlling a data processing operation of the memory device 1100.

A processor 4100 may output data, stored in the memory device 1100, via a display 4300 according to data input through an input device 4200. For example, the input device 4200 may be implemented as a pointing device such as a touch pad or a computer mouse, a keypad or a keyboard.

The processor 4100 may control the overall operation of the memory system 40000, and may control the operation of the controller 1200. In an embodiment, the controller 1200 capable of controlling the operation of the memory device 1100 may be implemented as a part of the processor 4100 or as a chip provided separately from the processor 4100.

Further, the controller 1200 may be implemented through the example of the controller 1200 illustrated in FIG. 1, and the memory device 1100 may be implemented through the example of the memory device 1100 illustrated in FIG. 1.

Figure 13:
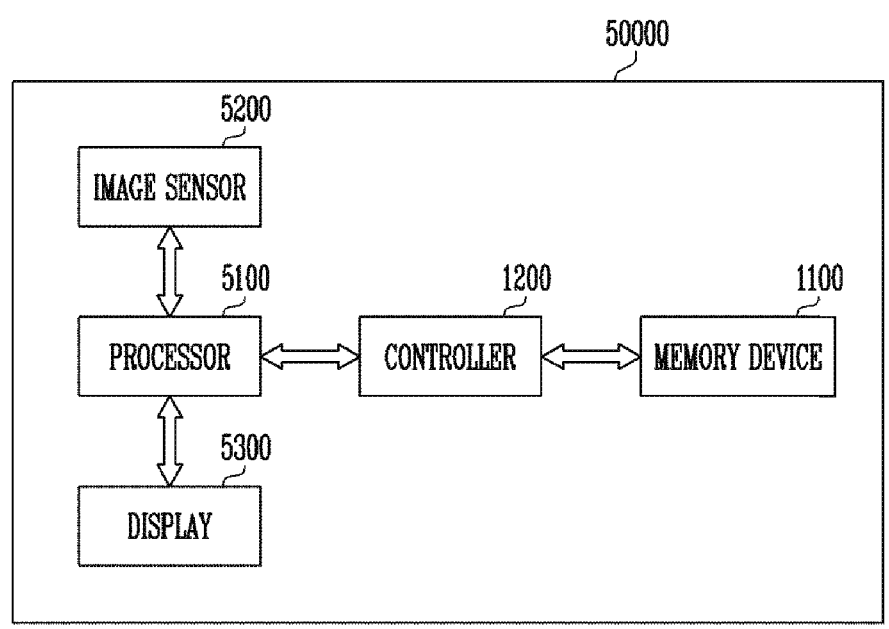
FIG. 13 is a diagram illustrating an embodiment of a memory system.

FIG. 13 is a diagram illustrating an embodiment of a memory system 50000.

Referring to FIG. 13, the memory system 50000 may be implemented as an image processing device, e.g., a digital camera, a mobile phone provided with a digital camera, a smartphone provided with a digital camera, or a tablet PC provided with a digital camera.

The memory system 50000 may include a memory device 1100 and a controller 1200 that is capable of controlling a data processing operation for the memory device 1100, for example, a program operation, an erase operation or a read operation.

An image sensor 5200 of the memory system 50000 may convert an optical image into digital signals, and the converted digital signals may be transmitted to a processor 5100 or the controller 1200. Under the control of the processor 5100, the converted digital signals may be output via a display 5300 or may be stored in the memory device 1100 through the controller 1200. Further, data stored in the memory device 1100 may be output via the display 5300 under the control of the processor 5100 or the controller 1200.

In an embodiment, the controller 1200 capable of controlling the operation of the memory device 1100 may be implemented as a part of the processor 5100 or as a chip provided separately from the processor 5100. Further, the controller 1200 may be implemented through the example of the controller 1200 illustrated in FIG. 1, and the memory device 1100 may be implemented through the example of the memory device 1100 illustrated in FIG. 1.

Figure 14:
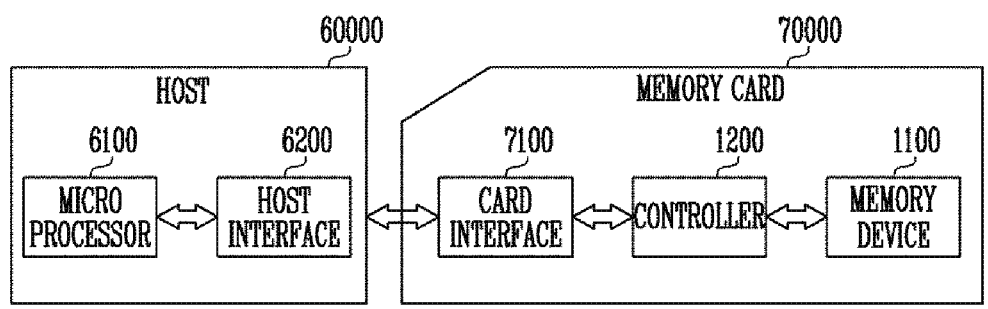
FIG. 14 is a diagram illustrating an embodiment of a memory system.

FIG. 14 is a diagram illustrating an embodiment of a memory system 70000.

Referring to FIG. 14, the memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In an embodiment, the card interface 7100 may be, but is not limited to, a secure digital (SD) card interface or a multimedia card (MMC) interface. Further, the controller 1200 may be implemented through the example of the controller 1200 illustrated in FIG. 1, and the memory device 1100 may be implemented through the example of the memory device 1100 illustrated in FIG. 1.

Further, the card interface 7100 may interface data exchange between a host 60000 and the controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the controller 1200 under the control of a microprocessor 6100.

In accordance with the present disclosure, the storage capacity of some memory blocks, among a plurality of memory blocks included in a semiconductor memory device, may be reduced, and thus the density of the memory blocks may be improved.

What is claimed is:

1. A semiconductor memory device, comprising:
   a memory cell array including a plurality of normal memory blocks and at least one system block; and
   a peripheral circuit configured to perform a program operation, a read operation, or an erase operation on the plurality of normal memory blocks or the at least one system block,
   wherein a data storage capacity of the at least one system block is less than a data storage capacity of each of the plurality of normal memory blocks, and
   wherein the plurality of normal memory blocks and the at least one system block share a plurality of bit lines.

2. The semiconductor memory device according to claim 1, wherein:
   each of the plurality of normal memory blocks comprises a plurality of memory strings coupled to each of the plurality of bit lines,
   the at least one system block comprises one or more memory strings coupled to each of the plurality of bit lines, and
   a number of the plurality of memory strings in each of the plurality of normal memory blocks is greater than a number of the one or more memory strings in the at least one system block.

3. The semiconductor memory device according to claim 1, wherein:
   the at least one system block comprises a plurality of memory strings, each memory string including a plurality of memory cells that are coupled in series, and
   at least two of the plurality of memory cells in each of the plurality of memory strings are coupled to one common word line.

4. The semiconductor memory device according to claim 3, wherein the at least two memory cells coupled to the one common word line are configured to allow identical data to be programmed thereto.

5. The semiconductor memory device according to claim 1, wherein:
   the at least one system block comprises a plurality of memory strings, each memory string including a plurality of memory cells that are coupled in series, and
   the plurality of memory cells in each of the plurality of memory strings are grouped into a plurality of memory cell groups, each memory cell group having at least two memory cells, and each memory cell group being coupled to any one of a plurality of common word lines.

6. The semiconductor memory device according to claim 5, wherein the at least two memory cells coupled to any one of the plurality of common word lines are configured to allow identical data to be programmed to the at least two memory cells.

7. The semiconductor memory device according to claim 1, wherein:
   the at least one system block comprises a plurality of memory strings, each memory string including a plurality of memory cells that are coupled in series, and
   part of the plurality of memory cells in each of the plurality of memory strings are grouped into a plurality of memory cell groups, each memory cell group including at least two memory cells.

8. The semiconductor memory device according to claim 7, wherein remaining memory cells other than the part of the plurality of memory cells are coupled to different word lines.

9. The semiconductor memory device according to claim 7, wherein each of the plurality of memory cell groups is coupled to any one of a plurality of common word lines.

10. The semiconductor memory device according to claim 7, wherein each of the plurality of memory cell groups is configured to allow identical data to be programmed to the memory cell group.

11. A semiconductor memory device, comprising:
- a memory cell array including a normal memory block and a system block; and
- a peripheral circuit configured to perform a program operation, a read operation, or an erase operation of the normal memory block and the system block,
- wherein the system block comprises a plurality of memory strings, and at least two memory cells of a plurality of memory cells included in each of the plurality of memory strings are coupled to a common word line.

12. The semiconductor memory device according to claim 11, wherein:
- the system block comprises N memory strings coupled to each of a plurality of bit lines, where N is a natural number, and
- the normal memory block comprises M memory strings coupled to each of the plurality of bit lines, where M is a natural number greater than N.

13. The semiconductor memory device according to claim 11, wherein the at least two memory cells coupled to the common word line are configured to allow identical data to be programmed to the at least two memory cells.

14. A method of operating a semiconductor memory device, comprising:
- providing a memory string including a plurality of memory cells that are coupled in series, wherein at least two memory cells of the plurality of memory cells are coupled to a common word line;
- programming system data to the at least two memory cells coupled to the common word line; and
- simultaneously reading the system data equally programmed to at least two memory cells.

15. The method according to claim 14, wherein the system data is a bootloader used by firmware of a memory system, address mapping data, or option parameter data.

* * * * *